(12) United States Patent
Cheng et al.

(10) Patent No.: US 11,158,534 B2
(45) Date of Patent: Oct. 26, 2021

(54) SOI SUBSTRATE

(71) Applicant: Taiwan Semiconductor Manufacturing Co., Ltd., Hsin-Chu (TW)

(72) Inventors: Yu-Hung Cheng, Tainan (TW); Cheng-Ta Wu, Shueishang Township (TW); Ming-Che Yang, Hsinchu (TW); Wei-Kung Tsai, Tainan (TW); Yong-En Syu, Tainan (TW); Yeur-Luen Tu, Taichung (TW); Chris Chen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/405,165

(22) Filed: May 7, 2019

(65) Prior Publication Data
US 2019/0259655 A1  Aug. 22, 2019

Related U.S. Application Data

(62) Division of application No. 15/904,915, filed on Feb. 26, 2018, now Pat. No. 10,304,723.
(Continued)

(51) Int. Cl.
*H01L 21/762* (2006.01)
*H01L 29/06* (2006.01)
(Continued)

(52) U.S. Cl.
CPC .. *H01L 21/76294* (2013.01); *H01L 21/76256* (2013.01); *H01L 29/0649* (2013.01);
(Continued)

(58) Field of Classification Search
CPC ... H01L 21/76294; H01L 21/84; H01L 21/78; H01L 21/782; H01L 27/1203; H01L 29/0657; H01L 21/76256
See application file for complete search history.

(56) References Cited

U.S. PATENT DOCUMENTS 5,340,435 A   8/1994 Ito et al.
5,810,994 A * 9/1998 Lee ........................... C25F 3/12
                                                         205/656
(Continued)

FOREIGN PATENT DOCUMENTS

JP    H02246210 A   10/1990
JP    2004327926 A  11/2004
KR    20110010326 A  2/2011

OTHER PUBLICATIONS

Hallstedt, Julius. "Integration of Epitaxial SiGe(C) Layers in Advanced CMOS Devices." Doctoral Thesis, Stockholm Sweden, 2007.
(Continued)

*Primary Examiner* — Marcos D. Pizarro
*Assistant Examiner* — Antonio B Crite
(74) *Attorney, Agent, or Firm* — Eschweiler & Potashnik, LLC

(57) ABSTRACT

The present disclosure, in some embodiments, relates to a silicon on insulator (SOI) substrate. The SOI substrate includes a dielectric layer disposed over a first substrate. The dielectric layer has an outside edge aligned with an outside edge of the first substrate. An active layer covers a first annular portion of an upper surface of the dielectric layer. The upper surface of the dielectric layer has a second annular portion that surrounds the first annular portion and extends to the outside edge of the dielectric layer. The second annular portion is uncovered by the active layer.

20 Claims, 7 Drawing Sheets

Related U.S. Application Data

(60) Provisional application No. 62/589,894, filed on Nov. 22, 2017.

(51) Int. Cl.
*H01L 29/16* (2006.01)
*H01L 21/84* (2006.01)
*H01L 27/12* (2006.01)
*H01L 21/02* (2006.01)
*H01L 21/311* (2006.01)

(52) U.S. Cl.
CPC .......... *H01L 29/0657* (2013.01); *H01L 29/16* (2013.01); *H01L 21/84* (2013.01); *H01L 27/1203* (2013.01)

(56) References Cited

U.S. PATENT DOCUMENTS

| | | | |
|---|---|---|---|
| 5,997,638 A * | 12/1999 | Copel | C30B 23/02 117/89 |
| 6,380,046 B1 * | 4/2002 | Yamazaki | H01L 21/76254 438/409 |
| 6,429,484 B1 * | 8/2002 | Yu | H01L 21/8221 257/347 |
| 8,173,551 B2 * | 5/2012 | Bai | H01L 21/02647 438/758 |
| 9,553,056 B1 * | 1/2017 | Afzali-Ardakani | H01L 23/576 |
| 2008/0099785 A1 | 5/2008 | Bai et al. | |
| 2011/0180849 A1 | 7/2011 | Hata | |
| 2014/0357028 A1 * | 12/2014 | Sassiat | H01L 21/823814 438/217 |
| 2015/0179520 A1 * | 6/2015 | Sadaka | H01L 21/7813 438/463 |
| 2015/0340488 A1 * | 11/2015 | Leobandung | H01L 29/785 257/401 |
| 2016/0204074 A1 | 7/2016 | Lin et al. | |
| 2017/0317221 A1 | 11/2017 | Usami | |
| 2018/0082836 A1 * | 3/2018 | Yan | H01L 29/66636 |
| 2018/0277652 A1 * | 9/2018 | Park | H01L 21/31053 |

OTHER PUBLICATIONS

Kongetira, et al. "Modeling of Growth Rates of Selective Epitaxial Growth (SEG) and Epitaxial Lateral Overgrowth (ELO) of Silicon in the SIH2CL2-HCLH2 System." (1994). ECE Technical Reports. Paper 202.

Loubet, et al. "Selective Etching of Si1-xGex Versus Si with Gaseous HCI for the Formation of Advanced CMOS Devices." Thin Solid Films 517 (2008) 93-97.

Godbey, et al. "Selective Removal of Si 1-x Gex From (100) Si Using HNO3 and HF." J. Electrochem. Soc., vol. 139, No. 10, Oct. 1992.

Loup, et al. "Silicon and SiGe Alloys Wet Etching Using TMAH Chemistry." Abstract #2101, 224th ECS Meeting, © 2013 The Electrochemical Society.

Notice of Allowance dated Mar. 29, 2019 for U.S. Appl. No. 15/904,915.

\* cited by examiner

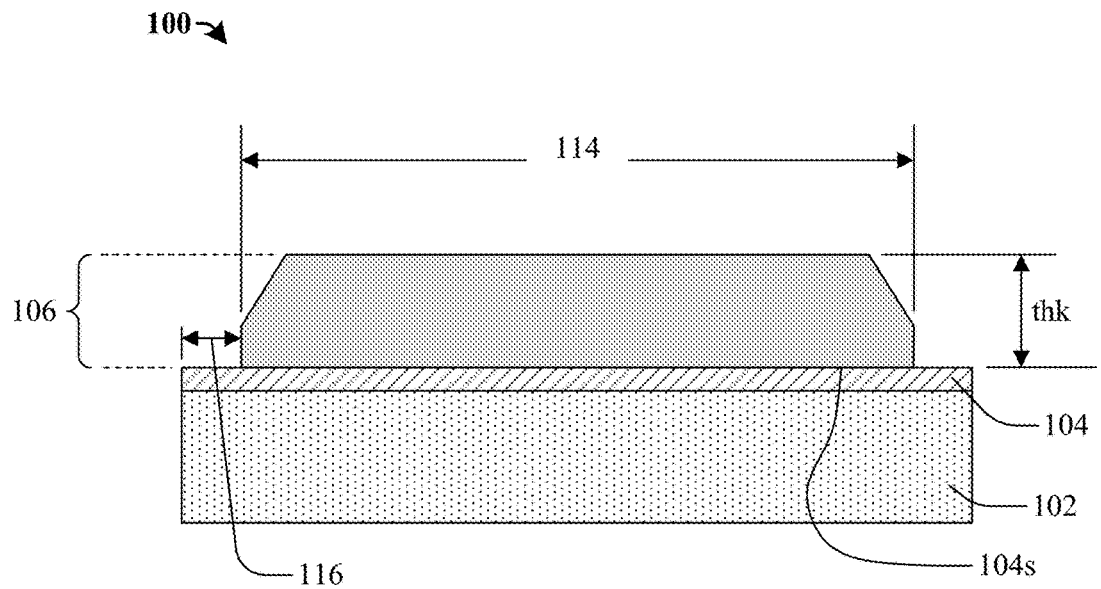
Fig. 1A
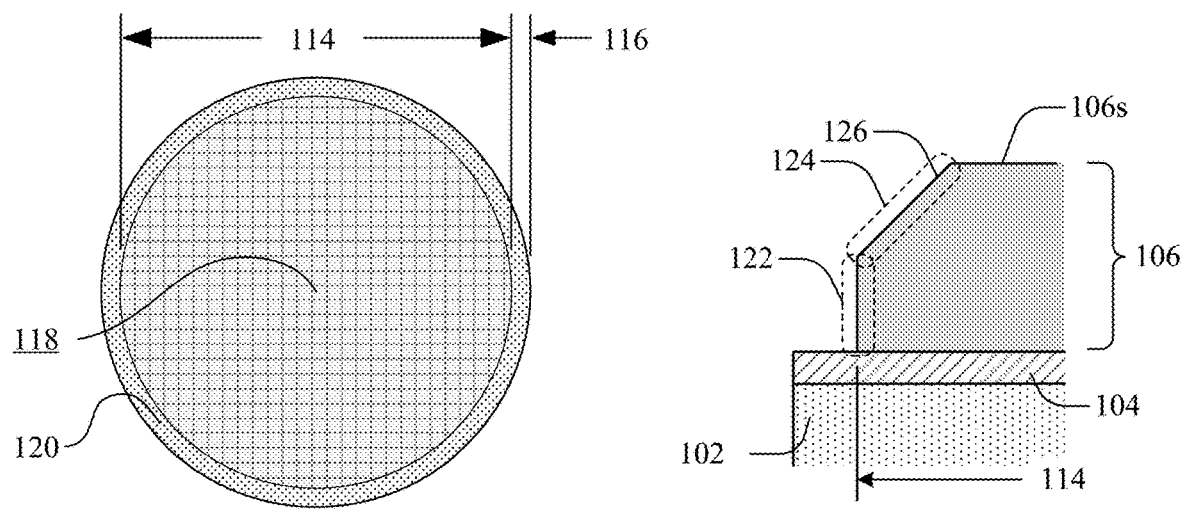
Fig. 1B
Fig. 1C

SOI SUBSTRATE

REFERENCE TO RELATED APPLICATION

This Application is a Divisional of U.S. application Ser. No. 15/904,915, filed on Feb. 26, 2018, which claims the benefit of U.S. Provisional Application No. 62/589,894, filed on Nov. 22, 2017. The contents of the above-referenced Patent Applications are hereby incorporated by reference in their entirety.

BACKGROUND

Integrated circuits are formed on semiconductor substrates and are packaged to form chips or microchips. Traditionally, integrated circuits are formed on bulk semiconductor substrates that are made from a semiconductor material, such as silicon. In more recent years, semiconductor-on-insulator (SOI) substrates have emerged as an alternative. SOI substrates have a thin layer of active semiconductor material (e.g., silicon) separated from an underlying handle substrate by a layer of insulating material. The layer of insulating material electrically isolates the thin layer of active semiconductor material from the handle substrate, thereby reducing leakage currents of devices formed within the thin layer of active semiconductor material. The thin layer of active semiconductor material can also provide for other advantages, such as faster switching times, lower operating voltages, and lower profile packaging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A-1C illustrates cross-sectional views of some embodiments of an SOI substrate according to some aspects of the present disclosure.

DETAILED DESCRIPTION

Figure 2:
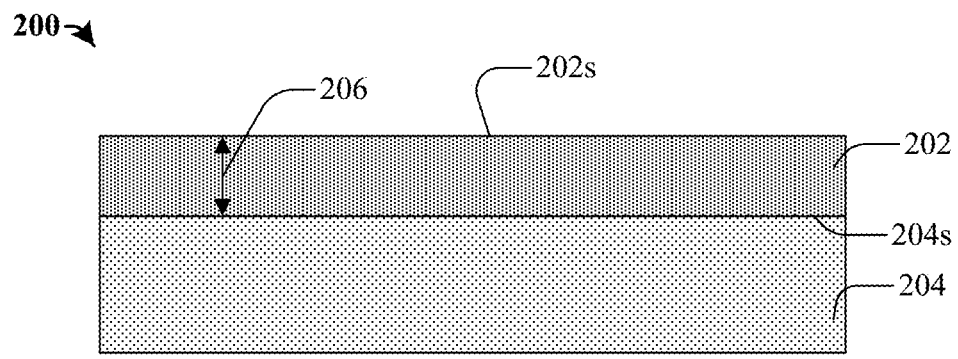
FIGS. 2-11 illustrate some embodiments of cross-sectional views showing a method of forming an SOI substrate in accordance with some aspects the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", and the like, may be used herein for ease of description to describe one element or feature's relationship to another element(s) or feature(s) as illustrated in the figures. The spatially relative terms are intended to encompass different orientations of the device or apparatus in use or operation in addition to the orientation depicted in the figures. The device or apparatus may be otherwise oriented (rotated 90 degrees or at other orientations) and the spatially relative descriptors used herein may likewise be interpreted accordingly. Even more, the terms "first", "second", "third", "fourth", and the like are merely generic identifiers and, as such, may be interchanged in various embodiments. For example, while an element (e.g., an opening) may be referred to as a "first" element in some embodiments, the element may be referred to as a "second" element in other embodiments.

Semiconductor-on-insulator (SOI) substrates are used in many modern day RF devices, including silicon-based photonics and high-accuracy micro electromechanical systems (MEMS). Devices formed within an SOI substrate may have an improved performance and a lower profile package compared to devices formed within a bulk substrate. The active semiconductor material within an SOI substrate may ideally have a relaxed mono-crystalline lattice, without defects and dislocations. Such a structure in the active semiconductor material promotes more effective current carrying for embedded semiconductor devices.

One method that can be used to form an SOI substrate comprises epitaxially growing a mono-crystalline silicon layer onto a silicon-germanium (SiGe) layer disposed over a sacrificial substrate. The SiGe layer is subsequently bonded to an oxide layer that is attached to a handle substrate. The sacrificial substrate and the SiGe layer are then removed using an etching process having an etching selectivity with the monocrystalline silicon layer, to leave an SOI substrate having the mono-crystalline silicon layer, the oxide layer, and the handle substrate.

However, it has been appreciated that is difficult to use this method to form a mono-crystalline silicon layer having a desirable thickness (e.g., between approximately 75 nm and approximately 150 nm for RF applications) onto the SiGe layer due to stresses imposed from a lattice mismatch with the SiGe layer. For example, the use of a SiGe layer having a low germanium concentration will allow for a thick mono-silicon layer to be formed over the sacrificial substrate, but it will also provide for poor thickness control of the mono-crystalline silicon layer due to a low etching selectivity with the mono-crystalline silicon layer. Alternatively, the use of a SiGe layer having a high germanium concentration will result in a better control of a total thickness variation of the mono-crystalline silicon layer (since the high germanium concentration provides the SiGe layer with a higher etching selectivity compared to silicon), but it also makes the mono-crystalline silicon layer more susceptible to dislocation defects along an upper surface of the layer due to high stresses imposed from lattice mismatch with the SiGe layer (e.g., epitaxially growing a mono-crystalline silicon layer to a thickness of 70 to 150 nm may result in dislocations along an upper surface of the mono-crystalline silicon layer). The dislocations will etch faster than the rest of the mono-crystalline silicon layer, resulting in the formation of divots along an upper surface of the mono-crystalline silicon layer. The divots can negatively impact the performance of devices within the SOI substrate.

The present disclosure, in some embodiments, relates to a cost-effective method of fabricating an SOI substrate having a mono-crystalline active layer that is substantially free of dislocation defects. The method comprises epitaxially forming a silicon-germanium (SiGe) layer over a sacrificial substrate. An active layer is epitaxially formed on the SiGe layer, with the active layer having a composition different than the SiGe layer. The sacrificial substrate is flipped and the active layer is bonded to an upper surface of a dielectric layer over a first substrate. The sacrificial substrate and the SiGe layer are removed, and a selective epitaxial growth is then performed to increase a thickness of the active layer. By using a selective epitaxial growth to increase a thickness of the active layer after removal of the SiGe layer, the active layer can be formed to a large thickness without causing dislocation defects in the active layer. Furthermore, the SiGe can have a high germanium concentration that provides for a good etching selectivity to improve a total thickness variation (TTV) of the active layer.

FIG. 1A illustrates a cross-sectional view of some embodiments of a disclosed SOI substrate having a mono-crystalline active layer that is substantially free of dislocation defects.

The SOI substrate 100 includes a first substrate 102 covered by a dielectric layer 104. The first substrate 102 may be, for example, a bulk silicon structure in the form of a disc-like substrate. In some embodiments, the first substrate 102 has a thickness ranging from approximately 200 µm to approximately 1000 µm. The dielectric layer 104 may be or may otherwise comprise, for example, a silicon oxide, a silicon carbide, a silicon nitride, a silicon rich oxide (SRO), or the like.

An active layer 106 is disposed directly on the dielectric layer 104. The active layer 106 is arranged on the dielectric layer 104. In some embodiments, the active layer 106 has a thickness of thk. In some embodiments, the thickness of thk of the active layer 106 may be in a range of between approximately 70 nm and approximately 150 nm. In some additional embodiments, the thickness of thk of the active layer 106 may be up to about 2000 nm. The active layer 106 has a mono-crystalline lattice that is relaxed and substantially free of dislocation defects. In some embodiments, the active layer 106 may comprise mono-crystalline silicon. In other embodiments, the active layer 106 may comprise a different semiconductor material. In some embodiments, the active layer 106 may also be a semiconductor compound made of elements from two or more different groups from the periodic table. For example, the elements can form binary alloys (two elements, e.g., GaAs), ternary alloys (three elements, e.g., InGaAs or AlGaAs), or quaternary alloys (four elements, e.g., AlInGaP).

The active layer 106 has a maximum width 114 defined by sidewalls which are laterally inset from the outer edge of the dielectric layer 104 by an outside edge width 116. By laterally insetting the active layer 106 from the dielectric layer 104, an upper surface of the dielectric layer 104 is exposed. In some embodiments, the outside edge width 116 may be between in a range of between approximately 1 mm (millimeter) and approximately 2 mm.

FIG. 1B illustrates a top view of the SOI substrate 100 of FIG. 1A. As illustrate in FIG. 1B, the active layer 106 covers a first annular portion 118 of the upper surface 104s of the dielectric layer 104. The outermost edges of the sidewalls of the active layer 106 define an inner boundary of a second annular portion 120 of the upper surface of the dielectric layer 104. The second annular portion 120 surrounds the first annular portion 118, and extends laterally across the edge width 116 to the outermost edge of the dielectric layer 104 and the first substrate 102. The second annular portion 120 is exposed on the upper surface 104s of the dielectric layer 104, being uncovered by the active layer 106.

Referring to FIG. 1C, the sidewalls of the active layer 106, when viewed in cross-section, comprise a lower portion 122 and an upper portion 124. The lower portion 122 has a substantially linear profile extending vertically upward from the dielectric layer 104. The upper portion 124 has an angled profile having a faceted shape 126 that tilts inwardly toward an upper surface 106s of the active layer 106. The upper surface 106s of the active layer 106 has a narrower width than the maximum width 114 of the active layer 106. In some embodiments, the epitaxially growth of the active layer 106 gives rise to the resulting faceted shape 126 of the upper portion 124 of the sidewalls of the active layer 106. In some embodiments, the crystalline structure of the faceted shape 126 may be described by Miller indices including a value of (1,1,1). In other embodiments, the crystalline structure of the faceted shape 126 may be described by Miller indices include different values (e.g., (1,1,0), (0,0,1), etc.).

Thus, the disclosed SOI substrate 100 has an active layer 106 that is a contiguous active layer of a semiconductor material that is substantially defect free and has a substantially relaxed lattice structure and a thickness of up to 150 nm or larger.

FIGS. 2-11 illustrate some embodiments of cross-sectional views corresponding to a method of manufacturing an SOI substrate having a mono-crystalline active layer that is substantially free of dislocation defects. The method provides for a good total thickness variation of a resulting active layer. For example, a total thickness variation of the resulting active layer may be less than about 4 nm. Although FIGS. 2-11 are described with reference to a method, it will be appreciated that the structures shown in FIGS. 2-11 are not limited to the method but rather may stand alone separate of the method.

As shown in cross-sectional view 200 of FIG. 2 a silicon-germanium (SiGe) layer 202 is epitaxially formed on an upper surface 204s of a sacrificial substrate 204. The sacrificial substrate 204 may be, for example, a bulk silicon structure in the form of a disc-like substrate. Such a substrate can have a diameter of 1-inch (25 mm); 2-inch (51 mm); 3-inch (76 mm); 4-inch (100 mm); 5-inch (130 mm) or 125 mm (4.9 inch); 150 mm (5.9 inch, usually referred to as "6 inch"); 200 mm (7.9 inch, usually referred to as "8 inch"); 300 mm (11.8 inch, usually referred to as "12 inch"); or 450 mm (17.7 inch, usually referred to as "18 inch"); for example. In some embodiments, the sacrificial substrate 204 may have a p-type doping (e.g., a p+ doping). In other embodiments, the sacrificial substrate 204 may have an n-type doping. In some embodiments, the sacrificial substrate 204 has a thickness in a range of between approximately 200 µm and approximately 1000 µm.

In some embodiments, the SiGe layer 202 may be formed directly upon the sacrificial substrate 204 by an epitaxial growth process. In other embodiments, an additional semiconductor layer (not shown) having a same composition as the sacrificial substrate 204 (e.g., silicon) may be formed over the sacrificial substrate 204 prior to the formation of the SiGe layer 202. In such embodiments, the additional semiconductor layer may have a reduced doping concentration (e.g., a p− doping) compared to the sacrificial substrate 204.

In various embodiments, the SiGe layer 202 may be formed by an epitaxial growth process such as molecular beam epitaxy, chemical vapor deposition (CVD), or low pressure CVD (LPCVD). During a CVD process, the sacrificial substrate 204 may be exposed to one or more volatile gas precursors which react and decompose on the upper surface 204s of the sacrificial substrate 204 to build up the SiGe layer 202 to a desired thickness 206. In some embodiments, the thickness 206 of the SiGe layer 202 may be in a range of between approximately 20 nm and approximately 200 nm.

In some embodiments, the SiGe layer 202 may comprise a substantially constant atomic percentage of germanium within the thickness 206 of the SiGe layer 202. In some embodiments, the substantially constant atomic percentage of germanium may in a range of between approximately 10 and approximately 100. In some embodiments, the substantially constant atomic percentage of germanium may in a range of between approximately 25 and approximately 35. In other embodiments, the SiGe may comprise a varied atomic percentage of germanium within the thickness 206 of the SiGe layer 202, which may be achieved by varying the precursor gasses as the deposition process builds up the SiGe layer 202. For example, the gas precursors and processing conditions may be initially chosen favoring a high concentration of silicon and a low concentration of germanium, thus promoting a lower lattice mismatch with an upper surface 204s of the underlying sacrificial substrate 204 and enhancing adhesion to the sacrificial substrate 204. As the SiGe deposition progresses, the gas precursors and process conditions may be progressively altered to increase the germanium concentration to a higher percentage near the upper surface 202s of the SiGe layer 202. The relatively high concentration of germanium along the upper surface 202s of the SiGe layer 202 enables a higher etching selectivity during subsequent etch processes. In some embodiments, a germanium concentration at the sacrificial substrate 204 may be about 0 to 20 atomic percent relative to a silicon concentration. In some embodiments, the germanium concentration at the upper surface 202s of the SiGe layer 202 may be approximately 10 to 100 atomic percent relative the silicon concentration.

Figure 3A:
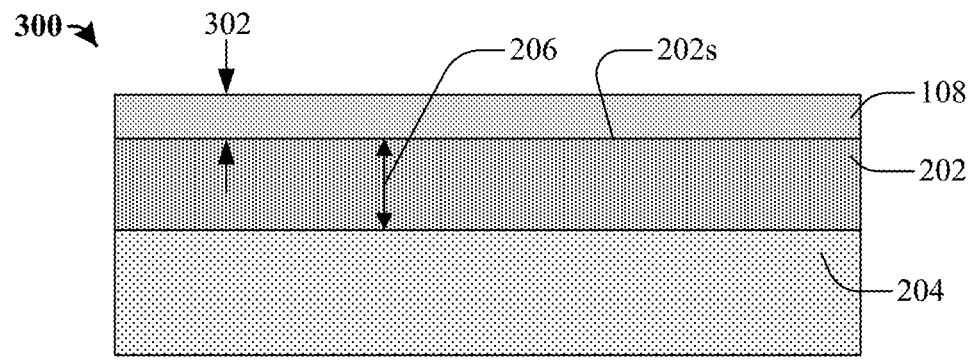

As shown in cross-sectional view 300 of FIG. 3A, a first active layer 108 is epitaxially formed on the SiGe layer 202. The first active layer 108 has a material composition different than the SiGe layer 202. For example, the first active layer 108 may comprise a semiconductor material such as silicon. In some embodiments, the first active layer 108 may comprise a layer of mono-crystalline silicon. The first active layer 108 can also be a semiconductor compound made of elements from two or more different groups from the periodic table. For example, the elements can form binary alloys (two elements, e.g., GaAs), ternary alloys (three elements, e.g., InGaAs or AlGaAs), or quaternary alloys (four elements, e.g., AlInGaP).

In various embodiments, the first active layer 108 may be epitaxially grown using vapor-phase epitaxy (VPE), molecular-beam epitaxy, liquid-phase epitaxy, or the like. In some embodiments, a VPE process may deposit silicon by reacting silicon tetrachloride and hydrogen gases at an elevated temperature of about 1200° C. In other embodiments, the VPE process may deposit silicon using silane, dichlorosilane, and/or trichlorosilane at a lower temperature of about 650° C. This process does not generate HCl as a by-product that may inadvertently etch the silicon. The growth rate of the silicon may be controlled to achieve a monocrystalline or a polycrystalline silicon structure.

The first active layer 108 may be grown to a desired thickness 302. In some embodiments, the thickness 302 of the first active layer 108 is in a range of between approximately 20 and approximately 50 nm. The thickness 302 of the first active layer 108 may be adjusted based on the atomic percentage of germanium in the SiGe layer 202, such that the first active layer 108 may accommodate the strain imposed by the SiGe layer 202 without generating dislocation defects.

Figure 3B:
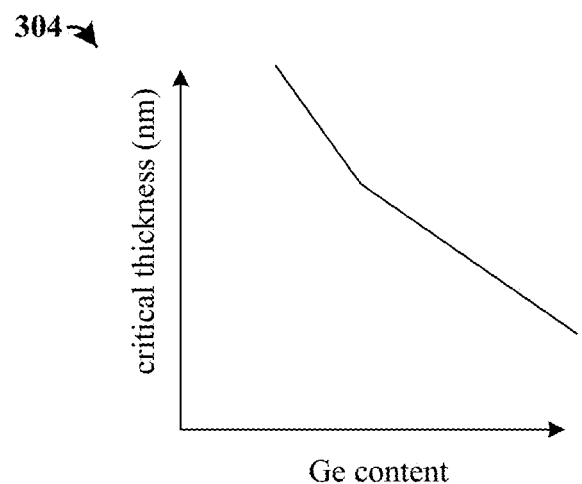

For example, FIG. 3B illustrates a graph 304 showing a critical thickness (i.e., a thickness above which defects form within a first active layer of epitaxial silicon) as a function of germanium content. As can be seen from FIG. 3B, as the germanium content increases, the thickness to which the first active layer 108 can be formed decreases. For example, at a germanium concentration of 0.3, the first active layer 108 can be formed to a thickness of approximately 20 nm without defects, while at a germanium concentration of 0.2 the first active layer 108 can be formed to a thickness of approximately 200 um without defects.

Figure 4:
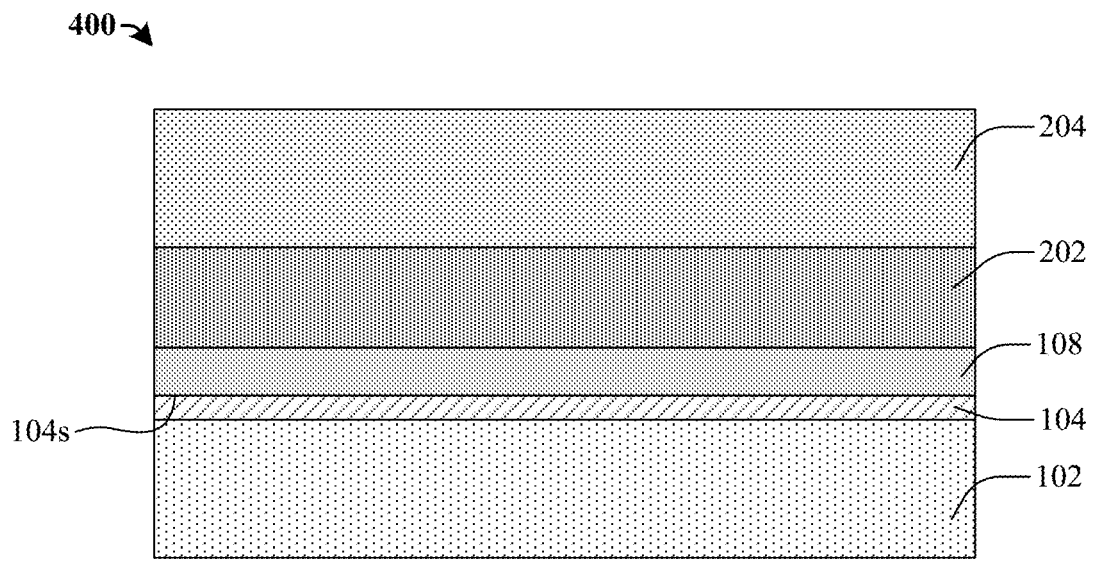

As shown in cross-sectional view 400 of FIG. 4, the sacrificial substrate 204 is flipped and the first active layer 108 is bonded to an upper surface 104s of a dielectric layer 104 of a first substrate 102. In some embodiments, a direct or fusion bonding process may be used. The direct bonding process relies on intermolecular interactions, such as van der Waals forces, hydrogen bonds and covalent bonds, to achieve a bond between two mating surfaces. The bond does not require any additional or intermediate layers on the surfaces to be bonded. In some embodiments, to increase bond strength an oxide layer (not shown) can be formed over the upper surface of the dielectric layer 104 prior to bonding, and the oxide layer can then be bonded to the mating surface of the first active layer 108. The direct bond may be formed at room temperature and may subsequently be annealed at elevated temperature.

In some embodiments, the first substrate 102 is provided for structural support, and thus can exhibit an absence of device features and an absence of interconnect features. In many instances, the first substrate 102 can take the form of a disc-like substrate. In some embodiments, the first substrate 102 may have a same diameter as the sacrificial substrate 204. The first substrate 102 may comprise a bulk silicon substrate, and may have a thickness ranging between approximately 300 nm and approximately 1000 nm.

Figure 5:
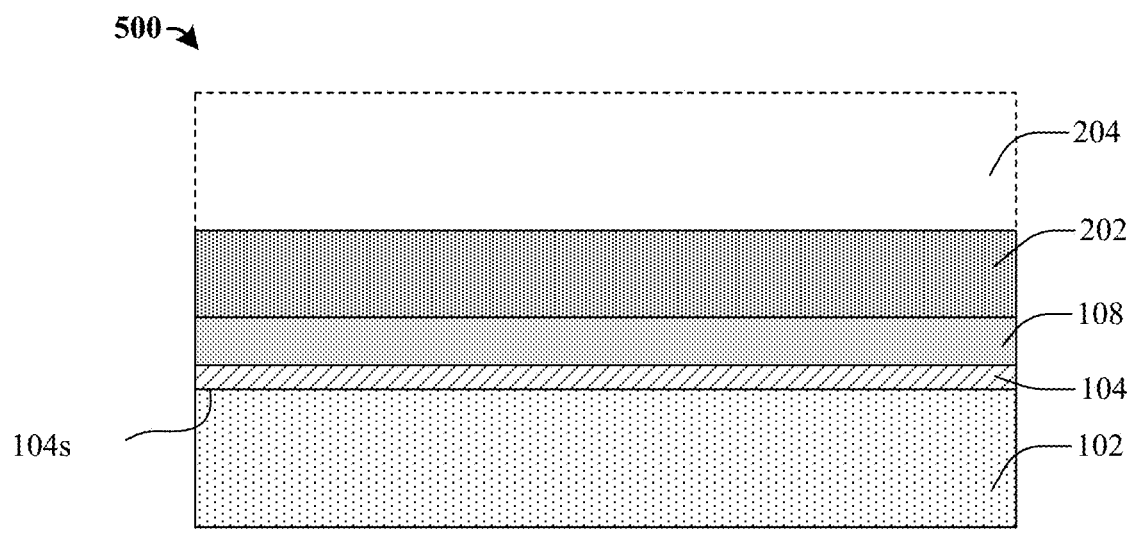

As shown in cross-sectional view 500 of FIG. 5, the sacrificial substrate 204 is removed following bonding to the first substrate 102. In some embodiments, the sacrificial substrate 204 may be removed by etching, physical grinding, and/or a chemical mechanical planarization (CMP) process. The etching process can include wet etching or dry etching. In some embodiments, the etching process may use a wet etchant comprising tetra methyl ammonium hydroxide (TMAH). In alternative embodiments, the wet etchants may include HNA (hydrofluoric, nitric, and acetic acid), potassium hydroxide (KOH), and/or buffered oxide etch (BOE). In some embodiments, the wet-etch action includes thinning the sacrificial substrate 204, followed by chemical mechanical polishing to fully remove the sacrificial substrate 204. In some embodiments, thinning includes a dry etch process.

Figure 6:
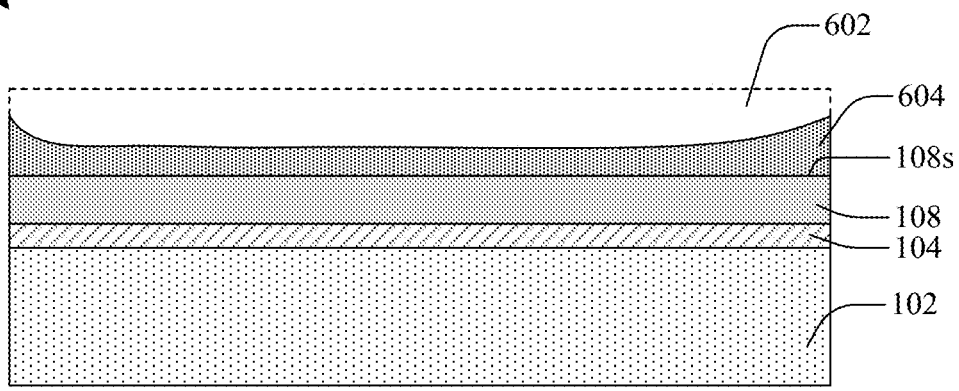

As shown in cross-sectional view 600 of FIG. 6, the SiGe layer 202 is partially removed. In some embodiments, the SiGe layer 202 may be partially removed, leaving a remaining SiGe layer 604 covering an upper surface 108s of the first active layer 108. In some embodiments, a wet-etch process using TMAH or KOH may be used to selectively remove an upper portion 602 of the SiGe layer 202. The wet-etch process is terminated prior to reaching an upper surface 108s of the first active layer 108 as certain etchants, such as TMAH, may aggressively etch an underlying epitaxial material such as silicon at a faster rate than a SiGe material, thus leading to undesirably large total thickness variation in the epitaxial material.

In some embodiments, the wet-etch process used to remove the SiGe layer 202 may also remove the additional semiconductor layer (not shown) having the reduced doping concentration relative to the sacrificial substrate 204. Because the TMAH has a high etching selectivity between silicon and silicon germanium (e.g., TMAH may etch silicon more than 20 times faster than SiGe), it provides for a good total thickness variation during removal of the additional semiconductor layer.

Figure 7:
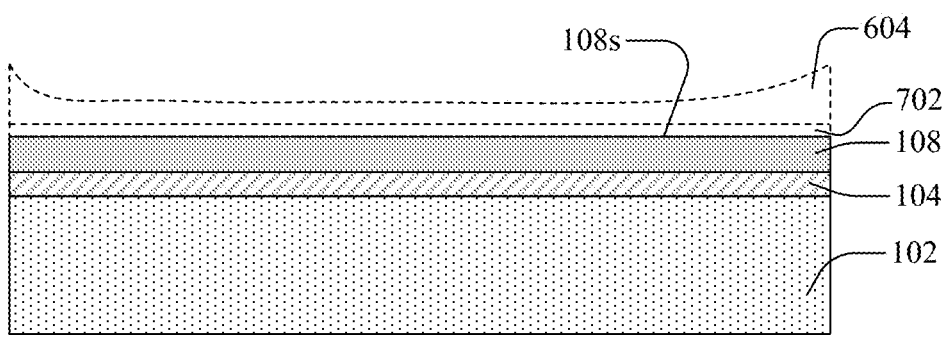

As shown in cross-sectional view 700 of FIG. 7, the remaining SiGe layer 604 is fully removed. In some embodiments, a dry or wet etching methods may be used to remove the remaining SiGe layer 604. The wet or dry etching methods may be selected to preferentially etch the remaining SiGe layer 604 as opposed to the first active layer 108. In some embodiments, a dry-etch method comprising a hydrogen chloride (HCl) etchant may be used. In some embodiments, such an etch process may be carried out at a temperature range of 500 to 700° C., and preferably at a temperature closer to 500° C. A lower temperature process mitigates against crystalline changes or defects occurring in the first active layer 108. In other embodiments, a wet-etch process comprising HCl may be employed to completely remove the remaining SiGe layer 604.

In some embodiments, the dry or wet etching methods may be continued after fully removing the remaining SiGe layer 604 to remove a thin layer 702 from the upper surface 108s of the first active layer 108, which may contain strain (i.e., the etch removes a strained part of the first active layer 108). By removing the thin layer 702, the crystalline structure of the first active layer 108 becomes substantially relaxed. In some embodiments, the thickness of the thin layer 702 that is removed may be in a range of between approximately 5 nm and approximately 10 nm. In some embodiments, the removal of the thin layer 702 may reduce the thickness of the first active layer 108 to be in a range of between approximately 10 nm and approximately 40 nm.

In some embodiments, an initial cleaning process is performed prior to removal of the remaining SiGe layer 604. The initial cleaning process removes native oxides that may have formed within the remaining SiGe layer 604 as a result of the partial removal of the SiGe layer 202. In some embodiments, a cleaning process may comprise a plasma assisted dry-etching process simultaneously exposing the remaining SiGe layer 604 to hydrogen, nitrogen trifluoride and ammonia plasma by-products. In some embodiments, such a cleaning process may be conducted at a temperature less than 400° C. to mitigate against crystalline changes occurring in the first active layer 108

Figure 8:
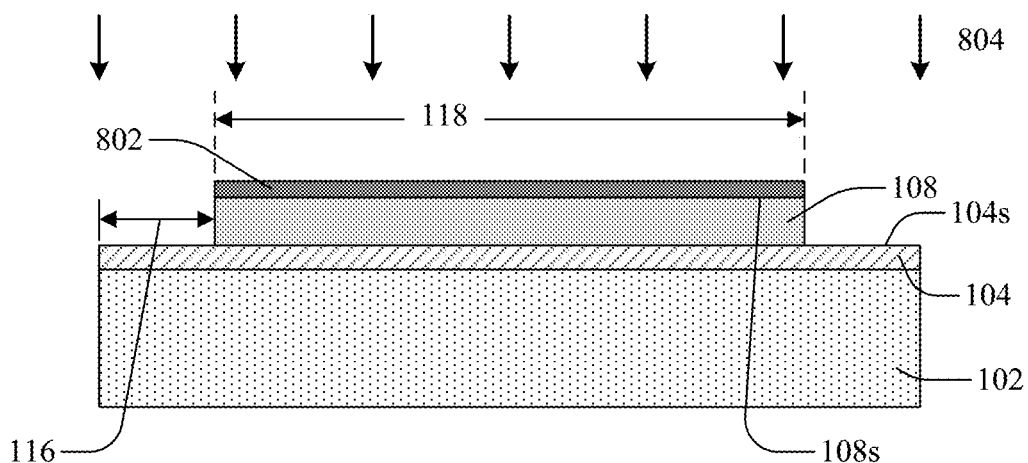

As shown in cross-sectional view 800 of FIG. 8, the first active layer 108 is selectively etched to define outermost sidewalls and to expose an outside edge width 116 of an upper surface 104s of the dielectric layer 104. In some embodiments, a masking layer 802 may be formed over a disc-shaped first annular portion 118 of the upper surface 108s of the first active layer 108. The masking layer 802 may extend radially from the center of the upper surface 108s of the first active layer 108 to an outer radius covering the first annular portion 118, thus exposing an outside edge of the first active layer 108 to etching. In some embodiments, the masking layer 802 may comprise an organic (e.g., photoresist, amorphous carbon, siloxane based materials, or the like) or an inorganic material (e.g., silicon oxide, silicon nitride, titanium nitride, or the like). In some embodiments, the outside edge width 116 of the dielectric layer may be between about 1 mm and about 2 mm. In some embodiments, the selective etching of the first active layer 108 to expose the outside edge width 116 may be performed using etchants comprising HCl or TMAH.

Selectively etching the first active layer 108 to expose the outside edge width 116 effectively reduces the total thickness variation for the first active layer 108. Prior etching processes used to remove the SiGe layer 202 and a thin layer 702 of the first active layer 108 may lead to more erosion and hence more thickness variation of the first active layer 108 at its outer edges. Etching away the outer edges of the first active layer 108 removes the localized high thickness variation material leading to a lower overall TTV for the first active layer 108. It also removes chip defects along an edge of the first active layer 108, which can occur during bonding of the first active layer 108 to the dielectric layer 104.

Figure 9:
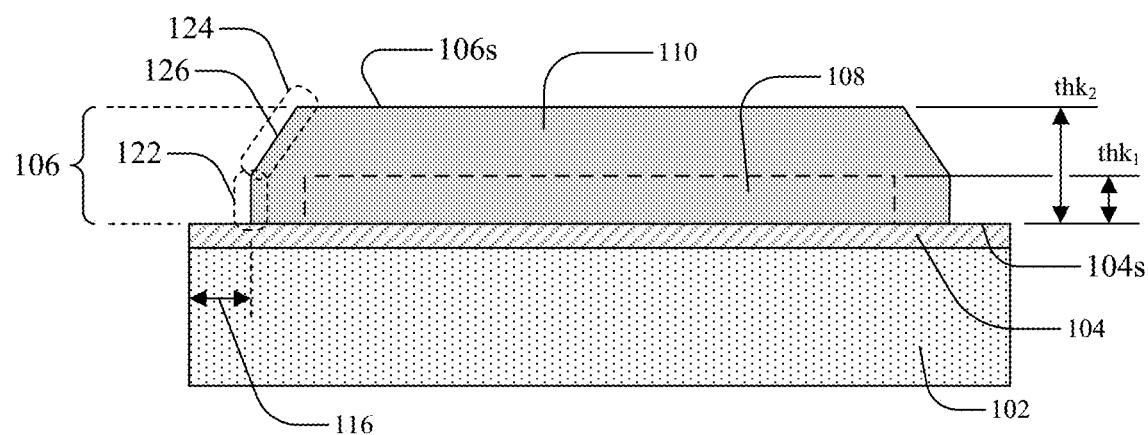

As shown in cross-sectional view 900 of FIG. 9, a second active layer 110 is epitaxially formed on the first active layer 108. The crystalline structure (i.e., the lattice) of the second active layer essentially duplicates the crystalline structure of the first active layer 108. Because the first active layer 108 is a relaxed layer that is substantially free of dislocation defects, the second active layer 110 can be formed to a desired thickness without formation of dislocation defects. In some embodiments, the second active layer 110 and the first active layer 108 collectively form an active layer 106 that is contiguous active layer. In some embodiments, the active layer 106 comprises Si. In some embodiments, the total thickness of the active layer 106 is about 70 to 150 nm. In other embodiments, the total thickness of the active layer is greater than 150 nm.

The second active layer 110 leaves an outside edge of the upper surface 104s of the dielectric layer 104 uncovered by either the first active layer 108 or the second active layer 110. After the masking layer 802 is stripped, the first active layer 108 (represented by the dash line) has an essentially planar upper surface, substantially vertical sidewalls, and is surrounded by the exposed outside edge width 116 of the upper surface 104s of the dielectric layer 104. The outside edge width 116 extends laterally from the outermost edges of the sidewalls of the first active layer 108 to the outside edge of the dielectric layer 104.

The second active layer 110 may be formed by a selective epitaxial growth (SEG) process that uses the first active layer 108 as a seed crystal for the growth of the second active layer 110. In some embodiments, the first active layer 108 may comprise silicon, and the SEG process may epitaxially grow silicon over exposed surfaces of the first active layer 108. In some embodiments, the SEG process may comprise precursor gasses including Dichlorosilane (DCS) with or without HCl; or Silane, Disilane, or trisilane with HCl. In some embodiments, a cyclic deposition-etch protocol may be followed to achieve SEG. Such a process may use Silane-based precursor gases and be conducted at a temperature below 550° C.

In some embodiments, the epitaxially grown second active layer 110 may be formed to have a faceted shape 126 of the upper portion 124 of the sidewalls of the active layer 106. In some embodiments, the crystal orientation of the faceted shape 126 may be described by Miller indices, and may have a value of (1,1,1). In other embodiments, the crystal orientation of the faceted shape 126 may be described by Miller indices having other values (e.g., (1,1,0), (0, 0, 1), etc.). The SEG of the second active layer 110 occurs in a generally isotropic fashion, extending in both the vertical and lateral directions in roughly a one to one ratio.

In some embodiments, the SEG protocol produces a single crystalline layer of Si known as an Epitaxial Lateral Overgrowth (ELO) layer.

The lateral direction growth of the second active layer 110 results in the second active layer 110 growing over the sidewalls of the first active layer 108, and abutting a part of the exposed outside edge width 116 of the upper surface 104s dielectric layer 104. While some very small actual reduction in the exposed outside edge width 116 occurs, the reduction is on a nanometer scale and likely about equal to the thickness growth ($thk_2-thk_1$) of the second active layer 110. The remaining exposed outside edge width 116 remains essentially between about 1 mm and 2 mm.

In some embodiments, a cross-sectional profile of the active layer 106 has sidewalls having a lower portion 122 and an upper portion 124. The lower portion 122 has a substantially linear profile extending vertically upward from the dielectric layer 104. The upper portion 124 has an angled profile in the shape of a taper or a facet that tilts inwardly toward an upper surface 106s of the active layer 106. The upper surface 106s of the active layer 106 has a narrower width than the maximum width 114 of the active layer 106. In some embodiments, the orientation and thus the cross-sectional profile of the upper portion 124 of the sidewalls of the active layer 106 may vary depending on the specific constituent materials and lattice characteristics of the first and second active layers. In some embodiments, the crystalline structure of the active layer 106 may be described by Miller indices, with the Miller indices comprising various values including a value of (1,1,1).

Figure 10:
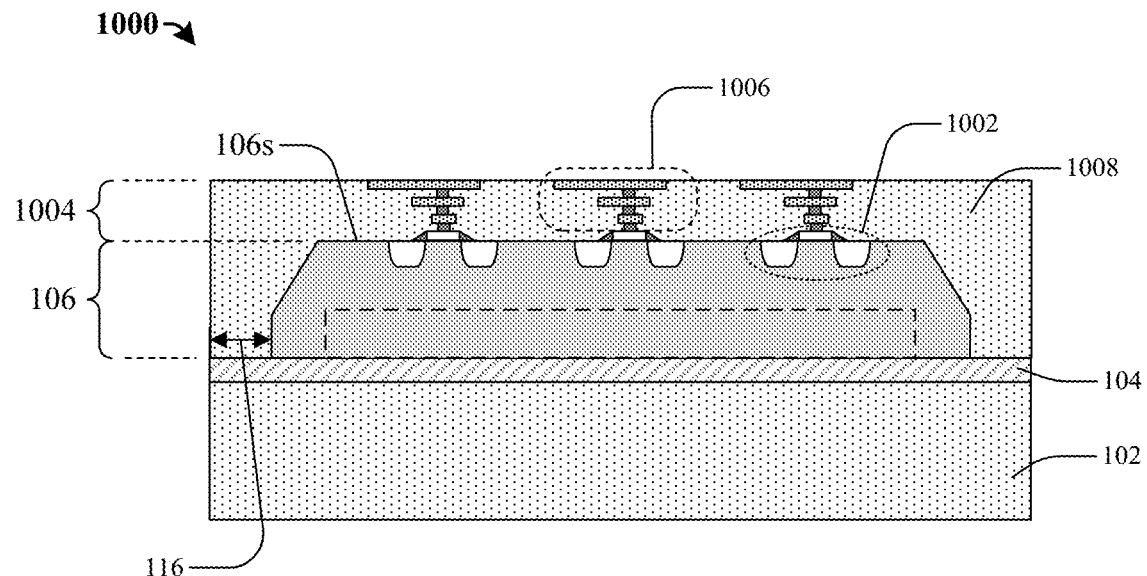

As shown in cross-sectional view 1000 of FIG. 10, a plurality of semiconductor devices 1002 are formed within the active layer 106. In various embodiments, the plurality of semiconductor devices 1002 may comprise MOSFETS and/or other field-effect transistors (FETs). Although not illustrated, the transistors can also take other forms, such as FinFET devices, bipolar junction transistors or the like.

Subsequently, an interconnect structure 1004 may be fabricated over the upper surface 106s of the active layer 106. The interconnect structure comprises a plurality of metal interconnect layers 1006 (e.g., metal lines, vias, and contacts) coupled to the plurality of semiconductor devices 1002 and surrounded by an interlayer dielectric (ILD) structure 1008. In some embodiments, the metal interconnect layers 1006 may comprise, for example, copper, tungsten, aluminum, gold, titanium or titanium nitride. In some embodiments, the ILD structure 1008 may comprise silicon oxide, silicon nitride, silicon oxynitride, a low κ dielectric, an extreme low κ dielectric, some other dielectric, or any combination of the foregoing.

Figure 11:
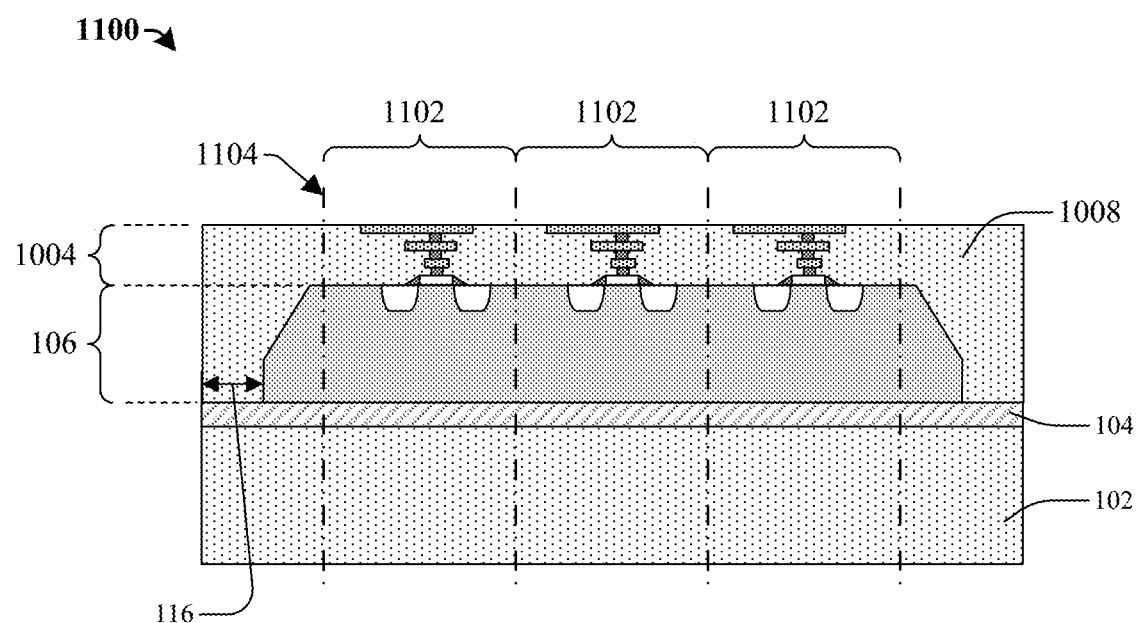

As shown in cross-sectional view 1100 of FIG. 11, the substrate is singulated (i.e., diced) to form a plurality of individual die 1102 from the second substrate 402. In some embodiments, individual die may be singulated from the second substrate 402 by scribing and breaking along scribe lines 1104, by mechanical sawing with a dicing saw, or by laser cutting or other applicable methods.

Figure 12:
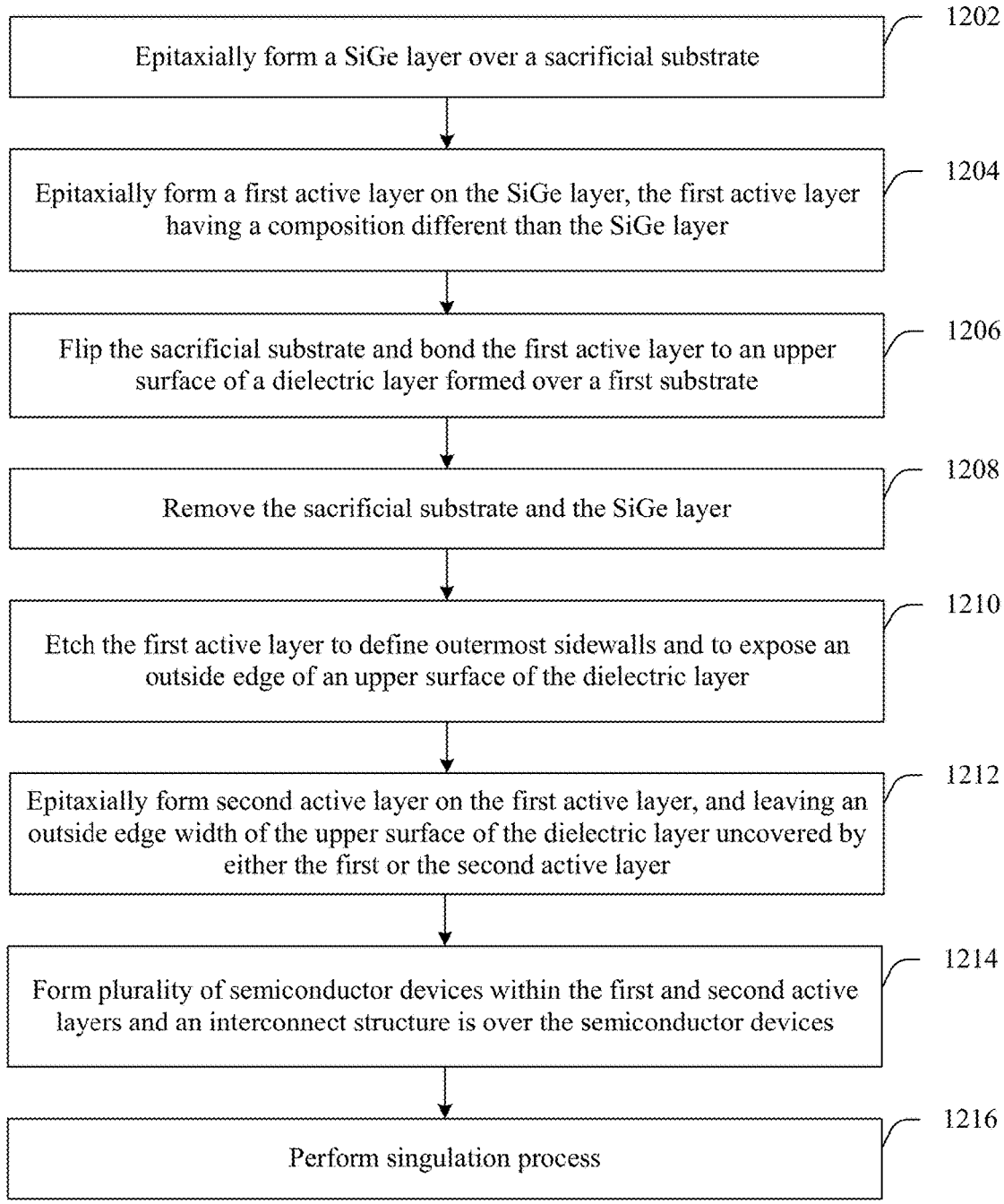
FIG. 12 illustrates a flow diagram of some embodiments of a method of forming an SOI substrate in accordance with some aspects the present disclosure.

FIG. 12 illustrates a flow diagram of some embodiments of a method 1200 of forming an SOI substrate.

While the disclosed method 1200 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1202, a SiGe layer is epitaxially formed over a sacrificial substrate. FIG. 2 illustrates a cross-sectional view 200 corresponding to some embodiments of act 1202.

At 1204, a first active layer is epitaxially formed on the SiGe layer, the first active layer having a composition different than the SiGe layer. FIG. 3 illustrates a cross-sectional view 300 corresponding to some embodiments of act 1204.

At 1206, the sacrificial substrate is flipped and the first active layer is bonded to an upper surface of a dielectric layer formed over a first substrate. FIG. 4 illustrates a cross-sectional view 400 corresponding to some embodiments of act 1206.

At 1208, the sacrificial substrate and the SiGe layer are removed. FIGS. 5-7 illustrate cross-sectional views 500-700 corresponding to some embodiments of act 1208.

At 1210, the first active layer is etched to define outermost sidewalls and to expose an outside edge of an upper surface of the dielectric layer. FIG. 8 illustrates a cross-sectional view 800 corresponding to some embodiments of act 1210.

At 1212, a second active layer is epitaxially formed on the first active layer, leaving an outside edge width of the upper surface of the dielectric layer uncovered by either the first or the second active layer. The first active layer and the second active layer collectively form a contiguous active layer. FIG. 9 illustrates a cross-sectional view 900 corresponding to some embodiments of act 1212.

At 1214, a plurality of semiconductor devices are formed within the first and second active layers and an interconnect structure is formed over the semiconductor devices. FIG. 10 illustrates a cross-sectional view 1000 corresponding to some embodiments of act 1214.

At 1216, a singulation process is performed to form a plurality of separate die. FIG. 11 illustrates a cross-sectional view 1100 corresponding to some embodiments of act 1216.

Accordingly, in some embodiments, the present disclosure relates to a method of forming an SOI substrate having a relatively thick (e.g., greater than 75 nm) mono-crystalline active layer that is substantially free of dislocation defects. The method provides for good total thickness variation (e.g., less than 4 nm) of the active layer.

In view of the foregoing, some embodiments of the present application provide for a method of fabricating an SOI substrate. The method comprises epitaxially forming a silicon-germanium (SiGe) layer over a sacrificial substrate. A first active layer is formed on the SiGe layer, with the first active layer having a composition different than the SiGe layer. The first active layer is bonded to a dielectric layer formed over a first substrate. The sacrificial substrate and the SiGe layer are removed. The first active layer is etched to expose an outside edge of an upper surface of the dielectric layer. A contiguous active layer is formed by epitaxially forming a second active layer on the first active layer, the first active layer and the second active layer have a substantially same composition.

Further, other embodiments of the present application provide for a method comprising epitaxially forming a silicon-germanium (SiGe) layer over a sacrificial substrate. A first active layer comprising a semiconductor material is epitaxially formed to a first thickness on the upper surface of the SiGe layer. The sacrificial substrate is flipped and the first active layer is bonded to a dielectric layer formed over a first substrate. The sacrificial substrate and a portion of the SiGe layer are removed while leaving a remaining portion of the SiGe layer covering an upper surface of the first active layer. The remaining portion of the SiGe layer and an upper portion of the first active layer are removed. A second active layer is formed on the first active layer, the first active layer and the second active layer collectively have a second thickness greater than the first thickness.

Still further, other embodiments of the present application provide for a silicon on insulator (SOI) substrate comprising a dielectric layer disposed over a first substrate, the dielectric layer having an outside edge aligned with an outside edge of the first substrate. An active layer covers a first annular portion of the dielectric layer. A second annular portion of the upper surface of the dielectric layer surrounds the first annular portion and extends to the outside edge of the dielectric layer. The second annular portion is uncovered by the active layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A silicon-on-insulator (SOI) substrate, comprising:
   a dielectric layer disposed over a first substrate, wherein the dielectric layer has an outside edge aligned with an outside edge of the first substrate;
   an active layer covering a first annular portion of an upper surface of the dielectric layer, wherein the upper surface of the dielectric layer has a second annular portion surrounding the first annular portion and extending to the outside edge of the dielectric layer, the second annular portion uncovered by the active layer and extending along a perimeter of the dielectric layer;
   a plurality of semiconductor devices disposed along a top surface of the active layer that is directly over the first annular portion;
   a plurality of interconnects disposed within a dielectric structure covering the top surface of the active layer and coupled to the plurality of semiconductor devices, wherein the dielectric structure extends from over the top surface to along a sidewall of the active layer and within the second annular portion, and wherein the plurality of interconnects are completely confined over the top surface; and
   wherein the active layer continuously extends between inner boundaries of the second annular portion along a line extending through a center of the first annular portion, wherein the active layer is relaxed and substantially free of dislocation defects, and wherein the active layer has a thickness in a range of between approximately 70 nm and approximately 150 nm.

2. The SOI substrate of claim 1, wherein the dielectric layer extends past opposing outermost sidewalls of the active layer by one or more distances that are in a range of between approximately 1 millimeter and approximately 2 millimeters.

3. The SOI substrate of claim 1, wherein the active layer has a smaller thickness along outermost edges of the active layer than at a center of the active layer.

4. The SOI substrate of claim 1, wherein the active layer is made of binary, ternary, or quaternary alloys.

5. The SOI substrate of claim 1, wherein the active layer has a plurality of die regions respectively comprising one or more of the plurality of semiconductor devices.

6. The SOI substrate of claim 1, wherein the sidewall of the active layer has a lower portion oriented at a first angle relative to the top surface of the active layer and an upper portion oriented at a second angle, which is different than the first angle, relative to the top surface of the active layer.

7. The SOI substrate of claim 6, wherein the dielectric structure extends past the sidewall of the active layer.

8. A silicon-on-insulator (SOI) substrate, comprising:
   a first substrate;
   a dielectric layer disposed over the first substrate, wherein the dielectric layer covers an entirety of an upper surface of the first substrate;
   an active layer covering a first annular portion of an upper surface of the dielectric layer, wherein the active layer has a sidewall comprising a lower portion oriented at a first angle relative to the upper surface of the dielectric layer and an upper portion oriented at a second angle, which is different than the first angle, relative to the upper surface of the dielectric layer;
   a plurality of semiconductor devices disposed along a top surface of the active layer; and
   a plurality of interconnect layers disposed within a dielectric structure over the top surface of the active layer and coupled to the plurality of semiconductor devices, wherein the dielectric structure extends past outermost sidewalls of the active layer and along the lower portion and the upper portion of the sidewall, and wherein the plurality of interconnect layers are completely confined directly above the top surface of the active layer.

9. The SOI substrate of claim 8, wherein the upper portion of the sidewall has Miller indicies of (111).

10. The SOI substrate of claim 8, wherein a bottom surface of the active layer facing the dielectric layer has a first width that is greater than a second width of the top surface of the active layer facing away from the dielectric layer.

11. The SOI substrate of claim 8, wherein the lower portion of the sidewall of the active layer is substantially perpendicular to the upper surface of the dielectric layer and is directly connected to a bottom surface of the active layer.

12. The SOI substrate of claim 8, wherein the upper surface of the dielectric layer laterally extends past the sidewall of the active layer.

13. The SOI substrate of claim 8, wherein the active layer has a mono-crystalline lattice that is substantially free of dislocation defects.

14. The SOI substrate of claim 8,
   wherein the active layer continuously covers the first annular portion of the upper surface of the dielectric layer; and
   wherein the upper surface of the dielectric layer has a second annular portion surrounding the first annular portion and extending to an outside edge of the dielectric layer, the second annular portion uncovered by the active layer.

15. A silicon-on-insulator (SOI) substrate, comprising:
   a first substrate;
   a dielectric layer disposed over the first substrate, wherein the dielectric layer extends to an outside edge of the first substrate;

an active layer disposed over the dielectric layer, wherein the active layer has a mono-crystalline lattice that is relaxed and substantially free of dislocation defects, and wherein the active layer has a thickness in a range of between approximately 70 nm and approximately 150 nm;

a plurality of semiconductor devices disposed along a top surface of the active layer; and a plurality of interconnects disposed within a dielectric structure covering the top surface of the active layer and coupled to the plurality of semiconductor devices, wherein the dielectric structure extends from directly over the active layer to outside of the active layer and wherein the plurality of interconnects are completely confined directly over the top surface of the active layer.

16. The SOI substrate of claim 15, wherein the active layer has a sidewall comprising a lower portion and an upper portion having a slope that is different than the lower portion.

17. The SOI substrate of claim 15, wherein the active layer has a greater width along a bottom surface facing the dielectric layer than along the top surface facing away from the dielectric layer.

18. The SOI substrate of claim 14, wherein the dielectric structure extends along a sidewall of the active layer, the sidewall comprising a lower portion and an upper portion having a slope that is different than the lower portion.

19. The SOI substrate of claim 15, wherein the thickness of the active layer varies by a non-zero amount between outermost sidewalls of the active layer.

20. The SOI substrate of claim 19, wherein the non-zero amount is less than approximately 4 nanometers.

* * * * *